United States Patent [19]
Oodaira et al.

[11] Patent Number: 4,694,138
[45] Date of Patent: Sep. 15, 1987

[54] METHOD OF FORMING CONDUCTOR PATH

[75] Inventors: Hirosi Oodaira, Chigasaki; Haruko Suzuki; Masayuki Saito, both of Yokohama; Masayuki Ohuchi, Tokyo, all of Japan

[73] Assignee: Kabushiki Kaisha Toshiba, Kawasaki, Japan

[21] Appl. No.: 677,017

[22] Filed: Nov. 30, 1984

[30] Foreign Application Priority Data

Feb. 10, 1984 [JP] Japan .................................. 59-23088

[51] Int. Cl.$^4$ ............................................. B23K 26/00
[52] U.S. Cl. ...................... 219/121 LM; 219/121 LD; 219/121 LF; 219/121 LJ; 427/229; 156/379.6; 437/173
[58] Field of Search .................. 219/121 LF, 121 LE, 219/121 LJ, 121 LH, 121 LM, 121 LD; 427/12, 53.1, 58, 88, 220, 229; 29/584, 590, 25.35; 156/379.6, DIG. 80

[56] References Cited

U.S. PATENT DOCUMENTS

| | | | |
|---|---|---|---|
| 4,181,538 | 1/1980 | Narayan et al. | 219/121 LF |
| 4,218,494 | 8/1980 | Belmondo et al. | 219/121 LF |
| 4,286,250 | 8/1981 | Sacchetti | 219/121 L |
| 4,338,506 | 7/1982 | Geller et al. | 219/121 LE |
| 4,489,230 | 12/1984 | Yamamoto | 219/121 LF |

FOREIGN PATENT DOCUMENTS 58-12392  1/1983  Japan .

OTHER PUBLICATIONS

A. R. Ramos et al., "Generation of Electrically Conductive Paths on Polymer Composites", Society of Plastic Engineers, 35th Annual Technical Conference, Apr. 1977.

*Primary Examiner*—M. H. Paschall
*Attorney, Agent, or Firm*—Oblon, Fisher, Spivak, McClelland, & Maier

[57] ABSTRACT

A conductor path is formed by providing an insulating substrate having a surface region which is formed of an insulating composition. The insulating composition contains an organic polymeric material and at least one metal source. The metal source is a metallic powder and/or an organic compound chemically combining a metal or metals. The surface region of the substrate is selectively heated along a predetermined pattern, thereby decomposing and evaporating the organic polymeric material at the heated portion and welding the metal in the heated portion so as to form a conductor path formed of the metal.

13 Claims, 9 Drawing Figures

METHOD OF FORMING CONDUCTOR PATH

BACKGROUND OF THE INVENTION

1. Field of the Invention

The present invention relates to a method of forming a conductor path, more particularly, to a method of forming a conductor path which is formed on an insulating substrate by selective heat-treatment and has good conductivity.

2. Description of the Prior Art

The formation of a conductor path is important for organically coupling electrical parts formed on a circuit substrate and manufacturing complicated electrical devices. Conventionally, such a conductor path is formed by using a copper wire, or a copper foil layer is formed on a printed circuit board. A method is known in which a so-called conductor paste, formed of a mixture containing a metallic powder and an insulation matrix material, is used to form such a conductor path.

However, in these conventional methods, a conductor path cannot be directly connected with electrical parts. In order to connect the conductor path to the electrical parts, solder is used, or a wire of gold, copper, aluminum or the like is bonded. For this reason, disconnection of the solder or the bonding wire causes degradation of reliability of the electrical devices, and a device size becomes large by the use of the solder or the bonding wire. Therefore, these disadvantages prevent a satisfactory electronic circuit configuration from being achieved.

In accordance with current demand for compact and light-weight electronic devices, a circuit in the device needs to be highly integrated, and therefore, micro-patterning of the wiring pattern is needed. However, since screen printing is performed in a current thick film circuit technique, micropatterning of a screen mask and the particle size of a metallic powder in a conductor paste are greatly limited, and a wiring width is practically limited to 100 μm. In addition, a wiring pattern is limited to a pattern of a mask. When a circuit design is changed, the mask design must be also changed. On the other hand, a thin metal film may be formed by vapour deposition, and etched to form a conductor circuit. However, a manufacturing process of this method is complicated, and a batch technique must be used, resulting in poor profitability.

In Japanese Patent Disclosure (Kokai) No. 55-14801 and No. 58-12392, a method is disclosed in which an insulating polymer is locally heated and a heated portion is carbonized to form a conductor path such as a resistor. However, in this method, since the obtained conductor path consists of carbon, the conductivity thereof is lower than that of a metal, and it has poor mechanical strength.

SUMMARY OF THE INVENTION

It is an object of the present invention to provide a method of forming a conductor path in which a conductor path having good conductivity can be precisely and finely formed in a desired pattern.

According to the present invention, a substrate having a surface region formed of an insulating composition which contains a metal source and an organic polymeric material is provided. Then, the surface region of the substrate is selectively heated in correspondence with a predetermined pattern, thereby causing organic polymeric components in the heated portion to decompose and evaporate. Simultaneously, metal components in the heated portion are welded to each other, thereby forming a metallic conductor path.

The metal source is a fine metallic powder or an organic compound chemically combining metal.

DETAILED DESCRIPTION OF THE PREFERRED EMBODIMENTS

A method of forming a conductor path according to the present invention will now be described with reference to FIGS. 1A to 1C.

Figure 1A:
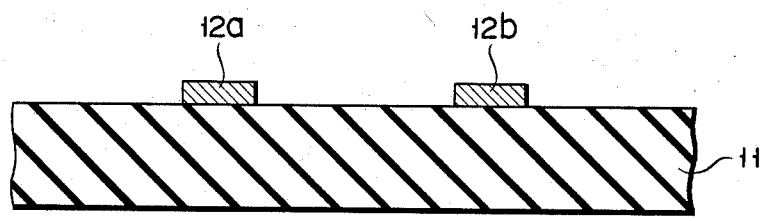
FIGS. 1A to 1C are respectively views for explaining a process of a method of forming a conductor path according to the present invention.

As shown in FIG. 1A, electrical parts 12a and 12b are mounted on an insulating substrate 11. The insulating substrate is formed of, for example, alumina or the like.

Figure 1B:
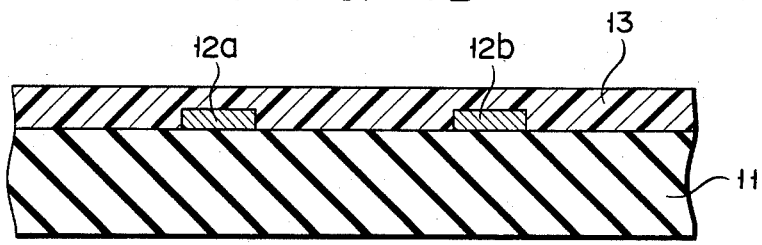
Figure 1C:
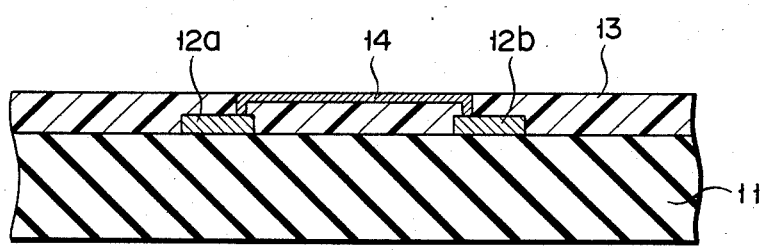

A layer 13 of an insulating composition containing an organic polymeric material and a metal source (both will be described later) is formed to cover a surface of the insulating substrate 11 and the electrical parts 12a and 12b, as shown in FIG. 1B. In this state, the electrical parts 12a and 12b are insulated from each other.

The insulating composition layer 13 is selectively heated in correspondence with a desired conductor path pattern so as to electrically connect the electrical parts 12a and 12b. This heating process can be performed by using any means which can selectively (locally) heat the insulating composition layer 13. In this case, laser light is preferably used, since it can be focused into a microspot having a size up to about twice the wavelength of light thereby forming a conductor path having a fine line width. When, for example, an Nd:YAG laser having a single wavelength of 1.06 μm is used, a conductor path having a minimum width of several micrometers can be formed. Laser light scans from one electrical part (e.g., the part 12a) toward the other electrical part (e.g., the part 12b). The laser light irradiates along a direction of depth of the layer 13 respectively on the electrical parts 12a and 12b so as to form a connection between the conductor path and the respective parts 12a and 12b. The organic polymeric material at a selectively heated portion is decomposed and evaporated, and metals in the heated portion of the insulating composition layer 13 are welded to each other, thereby forming a conductor path 14 which directly and electrically connects the electrical parts 12a and 12b.

After forming the conductor path, a protection layer (not shown) can be formed to cover it. This protection layer can be formed by an epoxy-melamine copolymer, an epoxy-acrylic copolymer, or the like.

The scanning operation of the laser beam with respect to the insulating composition layer 13 can be performed by reflection by a mirror with the substrate being fixed in position, tilting of a prism, or by moving the substrate 11 on an X-Y table. All of these methods can be controlled by a computer.

Figure 2:
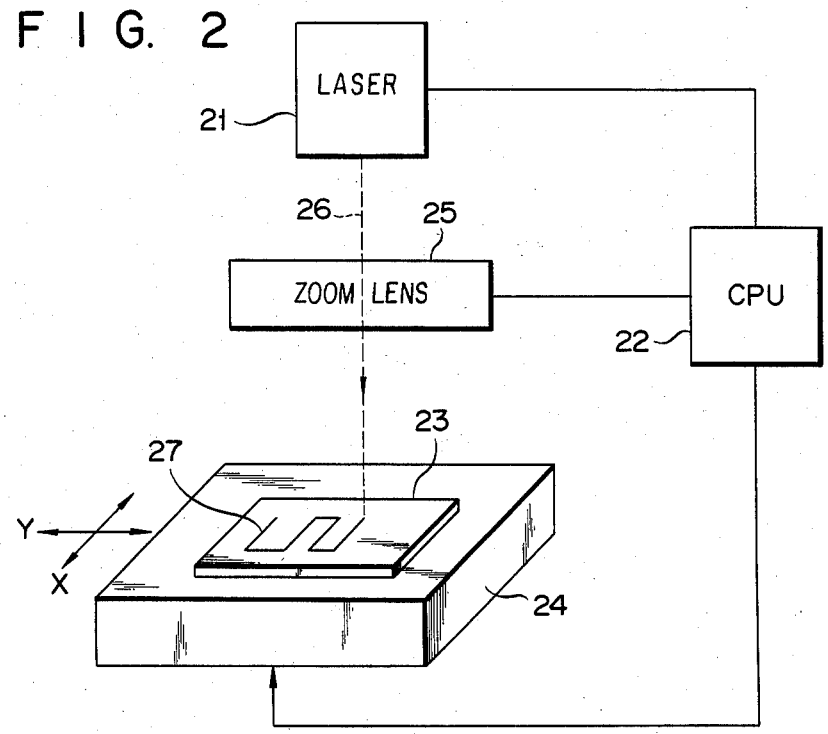
FIG. 2 is a view showing a laser beam irradiation system used in the method of forming the conductor path according to the present invention.

FIG. 2 shows a system for performing the scanning operation of a laser beam using an X-Y table. This system comprises a laser 21. The laser 21 is connected to a central processing unit (CPU) 22 storing predetermined conductor pattern data. A substrate 23 having an insulating composition layer according to the present invention is mounted on an X-Y table 24, and the X-Y table 24 is coupled to the CPU 22. A zoom lens 25 for adjusting a focal length of a laser beam 26 generated from the laser 21 is disposed between the laser 21 and the susbstrate 23 and is coupled to the CPU 22.

Upon operation of the CPU 22, the laser beam 26 is generated from the laser 21 and the X-Y table 24 is driven, thereby moving the substrate 23 along a predetermined conductor path pattern. The zoom lens 25 is controlled to make the laser beam 26 irradiate along a depth direction of the insulating composition layer on the electronic parts, thereby forming a conductor path 27 having the predetermined pattern.

In the present invention, the organic polymeric material constituting the insulating composition layer has a film-forming property and/or forming property and an insulating property. For example, the organic polymeric material includes an epoxy resin, phenolic resin, phenoxy resin, polyvinyl chloride resin, acrylic resin, polyvinyl butyral resin, polyvinyl ketone resin, polyimide resin, polyolefin resin, polycarbonate resin, polyamide resin, melamine resin, styrene resin, and the like. An organic polymeric material used in the present invention is preferably easily decomposed by heat energy, and preferably cannot be carbonized during this heat decomposition. From this point of view, examples of a useful organic polymeric material include acrylic resins, e.g., polyacrylic acid, polymethyl acrylate, polyethyl acrylate, polybutyl acrylate, polymethyl methacrylate, polyethyl methacrylate, and polybutyl methacrylate; thermosetting acrylic resins such as a copolymer of a poly-functional acrylic compound (e.g., triethylene diacrylate, pentaerythritol tryacrylate) with an acrylic resin; polyolefins, e.g., polyethylene and polypropylene; and paraffin wax. Furthermore, in view of heat resistance, humidity resistance, and adhesion properties with respect to the electrical parts, an acrylic resin, more particularly, polymethyl methacrylate and a copolymer thereof, the thermosetting acrylic resin and polyvinyl butyral are preferably used as polymeric materials.

The insulating composition of the present invention contains a metal source in addition to the abovementioned polymeric materials. The metal source is a metal powder or an organic compound chemically combining a metal or metals. Examples of metals are copper, nickel, aluminum, tungsten, molybdenum, titanium, gold, silver, platinum, and iron.

When the metal source is contained in the insulating composition in the form of powder, an amount thereof is 35% or less, but 5% or more of a total volume of the organic polymeric material and metallic powder. When the amount of the metallic powder exceeds 35% by volume, a high insulating property of $10^{10}$ $\Omega$.cm or more cannot be obtained. On the other hand, when the amount of the metallic powder becomes less than 5% by volume, a satisfactory conductor path cannot be formed. A preferable amount of the metallic powder is 10 to 20% by volume. A diameter of metallic powder particles is not particularly limited if a conductor path can be formed by means of welding each other by heating. The preferable diameter of the metallic powder particles is 0.2 $\mu$m or less. Such an ultra-fine powder metal is gray to black in color. In addition, when such an ultra-fine powder metal is used, a conductor path having a line width of 20 $\mu$m or less can be continuously and easily formed. In order to stabilize a surface condition of the fine powder metal, it can be heated in the air so as to oxydize only its surface. The metallic powder is added in a solution of the organic polymeric material in a suitable solvent and is kneaded, thereby providing the insulating composition. When the metallic powder such as a copper powder which can be easily oxidized is used, irradiation of the laser beam is preferably performed in an inert gas (e.g., nitrogen gas) atmosphere or in a reducing gas atmosphere.

An organic compound chemically combining a metal includes an alkyl metal in which each alkyl group has 1 to 20 carbon atoms; an alkoxy metal in which each alkoxyl group has 1 to 10 carbon atoms; a metal carboxylate (e.g., formate, acetate, acrylate, and methacrylate); and a metal acetylacetonate. The organic compound includes an organic polymeric compound such as the above-mentioned organic polymeric material. In the case wherein the organic compound bonded with a metal is used as the metal source, since it has good compatibility with the organic polymeric material, the resulting insulating composition has transparency. In view of insulation property and formation of a good conductor path by heating, the organic compound chemically combining a metal is mixed with the organic polymeric material such that the total number of the metal atoms amounts to 0.1 to 20%, preferably 1 to 10% of the sum of the number of the atoms constituting the organic polymeric material plus the number of the atoms constituting the organic compound chemically combining metal. The organic compounds combining a metal is decomposed by heating so as to liberate the metal, and the liberated metal is welded to each other, thereby forming a conductor path.

The insulating composition of the present invention can contain an inorganic powder such as carbon black. This inorganic powder efficiently absorbs heat energy, facilitating the formation of a conductor path.

In the case wherein the insulating composition of the present invention is selectively heated and a conductor path formed of a welded metal in the heated portion is formed, power of laser beam used can be relatively low, e.g., power of 3 to 8 W with respect to a laser beam having a spot size of 60 $\mu$m.

Figure 3:
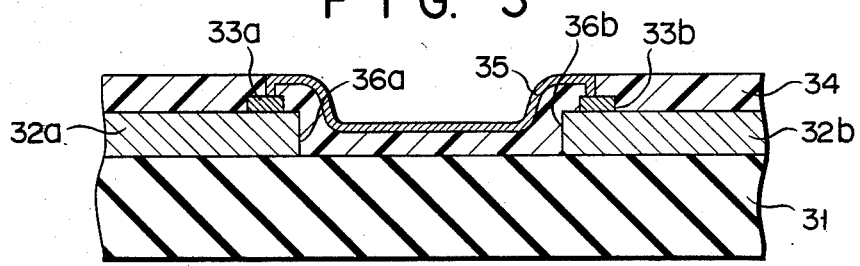
FIGS. 3 to 7 are views respectively showing other embodiments according to the present invention.

FIG. 3 shows another embodiment according to the present invention wherein a conductor path which directly connects electrical parts at desired positions is formed by a method of the present invention. IC chips 32a and 32b are mounted on an insulating substrate 31 to be spaced apart each other. The IC chips 32a and 32b respectively have connecting terminals 33a and 33b. An insulating composition layer 34 is formed to cover the insulating substrate 31 and the IC chips 32a and 32b. Laser beam scans from one terminal 33a toward the other terminal 33b in the same manner as described in FIGS. 1A to 1C and 2. Thus, a conductor path 35 is formed to connect the IC chips 32a and 32b. When respective scriber surfaces of the IC chips 32a and 32b are brought into contact with the conductor path 35, a problem occurs. However, according to the present invention, since the conductor path 35 can be formed in a surface region of the insulating composition layer 34 and along a direction of depth of the IC chips 32a and 32b, portions of the layer 34 at which the scriber surfaces 36a and 36b are in contact therewith can be maintained to be insulated. Therefore, no problem occurs.

Figure 4:
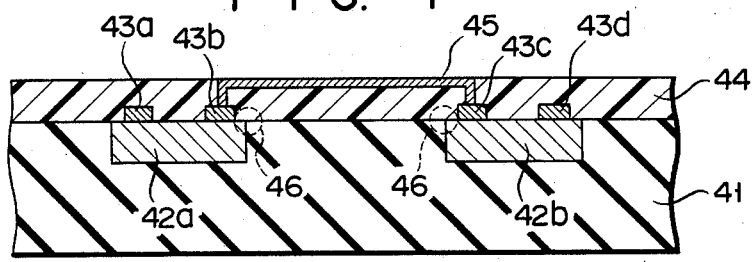

FIG. 4 shows still another embodiment according to the present invention in which a conductor path for connecting electrical parts buried in an insulating substrate is formed. For example, IC chips 42a and 42b are buried in an insulating substrate 41 formed of a resin, so that respective surfaces thereof are within the identical plane with the substrate 41. Although connecting terminals 43a, 43b, 43c, and 43d of the respective IV chips 42a and 42b are depicted such that they project from the above-mentioned plane, they are, in fact, substantially flush with the chip surfaces. An insulating composition layer 44 is formed so as to cover the plane including the substrate 41 and the IC chips 42a and 42b, and the connecting terminals 43a, 43b, 43c and 43d. A conductor path 45 is formed to connect the IC chips 42a and 42b by the connecting terminals 43b and 43c in the same manner as described in FIGS. 1A to 1C and FIG. 2. When the IC chips 42a and 42b having such a configuration are connected by wirings formed by deposition of a metal, the wirings may be disconnected at an interface 46 between the IC chips 42a and 42b and the substrate 41 by a difference between thermal expansion coefficients thereof. However, according to the present invention, this can be prevented.

Figure 5:
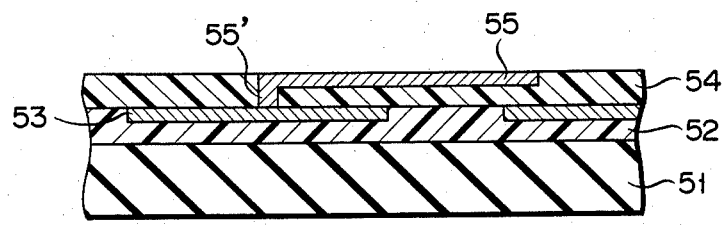

FIG. 5 shows still another embodiment wherein a multilayer wiring or interconnection is formed by a method according to the present invention. A first insulating composition layer 52 according to the present invention is formed on a surface of an insulating substrate 51. Then, the layer 52 is locally heated to form a predetermined first conductor path 53 in the same manner as described in FIGS. 1A to 1C and FIG. 2. Thereafter, a second insulating composition layer 54 according to the present invention is formed to cover the first layer 52. Then, the second layer 54 is selectively heated to form a second conductor path 55 for connecting with the first conductor path 53 in the same manner as described in FIGS. 1A to 1C and FIG. 2. As described above, since the laser beam can scan along a direction of depth of the layer 54, a portion 55′ connecting the first conductor path 53 with the second conductor path 55 can be easily formed. It should be noted that, unlike in FIG. 5, the layer 54 may be formed not to cover an overall surface of the layer 52, but to partially cover the layer 52, and the second conductor path 55 may be formed in the covered portion, thereby forming a jumper circuit. Furthermore, an insulating composition layer of the present invention can be formed on the second layer 54, and a conductor path can be formed therein.

Figure 6:
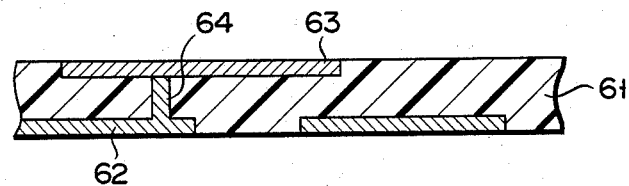

FIG. 6 shows still another embodiment in which conductor paths are formed in two surfaces of an insulating substrate and these conductor paths are connected through the substrate. In this embodiment, an overall insulating substrate 61 is formed of an insulating composition of the present invention. A laser beam irradiates two surfaces of the substrate 61 along a desired pattern as described in FIGS. 1A to 1C and FIG. 2, thereby forming conductor paths 62 and 63 on respective surfaces. A portion 64 connecting the conductor paths 62 and 63 can be easily formed by irradiating a laser beam from the surface of the substrate along a direction of depth.

Figure 7:
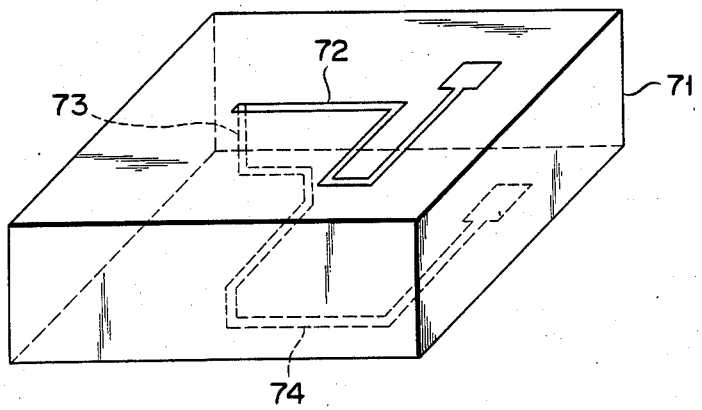

FIG. 7 shows still another embodiment in which a conductor path is formed in a three-dimensional manner in an insulating substrate. As described in FIGS. 1A to 1C and FIG. 2, a laser beam scans a surface of an insulating substrate 71 formed of an insulating composition of the present invention along a desired pattern in a two-dimensional manner so as to form a two-dimensional conductor path portion 72. Then, the laser beam scans along a direction of depth of the substrate 71 for forming a conductor path portion 73 which reaches an opposite surface. The laser beam scans in a two-dimensional manner again so as to form a two-dimensional conductor path portion 74 in the opposite surface. In order to form such a three-dimensional conductor path, a substrate preferably has high transparency. Therefore, (metha)acrylic resin, thermosetting acrylic resin, styrene resin or the like is preferably used as an organic polymeric material. In addition, an organic compound chemically combining a metal or metals is preferably used as a metal source.

The present invention will be described by way of examples hereinafter.

EXAMPLE 1

(A) Polymethyl methacrylate was dissolved in N,N-dimethyl formamide to have a concentration of 20%. 80 g of an ultrafine powder copper (available from Shinku Yakin Kogyo KK, Japan) of a particle diameter of 0.05 $\mu$m were mixed with 100 g of the solution (copper powder content; 31% by volume). Then, this mixture was kneaded to obtain a resin paste having homogeneously dispersed copper powder.

Meanwhile, two square resistor chips of a size of 3.6 mm$\times$2.6 mm$\times$0.6 mm which are respectively provided with electrodes were mounted on an alumina substrate to be spaced apart each other (FIG. 1A).

The above-mentioned paste was coated to cover the resistor chips and the alumina substrate, and the resultant structure was dried at 80° C. for 30 minutes. A thickness of the thus coated film had variations; a thickness of the coated film above the electrode of the resistor chip was about 25 $\mu$m, and that between the resistor chips (above the substrate) was about 50 $\mu$m.

A laser beam irradiated in a nitrogen atmosphere the thus obtained insulation film at a spot diameter of 50 $\mu$m, an output power of 6 W, and at a scanning speed of 5 mm/sec on the respective resistor chips and that of 20 mm/sec between the resistor chips by using an Nd:YAG laser (LAY711; available from TOSHIBA CORPORATION). Continuity in a conductor pattern was confirmed with a tester at an electrode portion of the other end of the resistor chip on which no conductor was formed. Note that the film between the electrodes had a resistance of $10^8 \Omega$ before irradiation with the laser beam.

(B) In order to measure an electrical resistance of this conductor path, the above-mentioned resin paste containing the fine copper powder was coated on the alumina substrate to have a thickness of 20 $\mu$m. Then, a bent conductor path having twenty corners at 3-cm intervals was formed under the above irradiation condition and at a scanning speed of 10 mm/sec. The resistance of the thus formed conductor path was measured. When the measured resistance was calculated into a sheet resistivity per unit area, it was 8 m$\Omega$/□. Since an Ag/Pd-based conductor paste which is generally used as a thick film paste has a unit resistance of 20 m$\Omega$/□, the obtained value indicates that the conductor path of the present invention has good electrical conductivity in comparison to a conventional one, thereby allowing its practical use.

EXAMPLE 2

The same procedures as in Example 1(B) was repeated except that an ultrafine nickel powder (a particle diameter of 300 Å; available from Shinku Yakin KK) was used instead of the copper powder in the same volume ratio. A connection between respective resistor chips could be sufficiently maintained, and the sheet resistivity of the conductor path was 30 mΩ/□.

EXAMPLE 3

Carbon black was mixed in the amount of 0.05% by weight with a solution in methyl ethyl ketone (MEK) of a resin composition consisting of a copolymer of methyl methacrylate and ethyl acrylate (molar ratio: 70/30). To this mixture an ultrafine aluminum powder (a particle diameter of 1,000 Å; available from Shinku Yakin KK) was added to obtain an insulation paste containing 25% by volume of the aluminum powder. By using this paste, the resistor chips were connected in the same manner as in Example 1(B), and the sheet resistivity was measured of the wiring pattern. It should be noted that when the laser beam was irradiated, a forming gas of $N_2/H_2=9/1$ was used instead of nitrogen gas. When the output of the laser beam was set at 7.3 W, the connection between the resistor chips could be satisfactorily maintained, and the average sheet resistivity of the wiring pattern was 25 mΩ/□.

EXAMPLE 4

In this example, a conductor path (wiring) formed of an Ag film is formed on an $Al_2O_3$ substrate. As shown in FIG. 1A, electrodes (electrical parts) 12a and 12b of thick film conductors were formed on an $Al_2O_3$ substrate 11. Then, 80 g of an Ag powder (raw material for conductor path) having a particle diameter of about 0.1 to 0.5 μm, 67 g of an acrylic resin "Aron S 4090" (available from Toa Gosei KK), and n-butylcarbitol were mixed to obtain a paste. This paste was coated on the substrate 11, as shown in FIG. 1B, and the resultant structure was dried at 150° C. for 30 minutes. The thus formed insulation layer includes 16% by volume of Ag powder. Thereafter, a Nd:YAG laser beam irradiated (at a beam output of 3 W, a scanning speed of 10 mm/sec, and a beam spot diameter of 50 μm). A film portion irradiated with the laser beam was heated and the resin was decomposed to be gasified. On the other hand, the Ag powder was welded, thus forming a linear conductive path. A width of this path was about 5 μm which was the substantially same as the beam spot diameter, and a sheet resistivity thereof was 7.8 mΩ/□. A portion which was not subjected to the laser beam irradiation had sufficient insulation property.

EXAMPLE 5

In this example, a conductor path (wiring pattern) formed of a Cu film was formed on a resin substrate. 80 g of Cu powder having an average particle diameter of 0.1 to 1 μm, 35 g of acrylic resin "Aron S 4090" (available from Toa Gosei KK) and n-butylcalbitol were mixed to obtain a paste. Note that the volume of this paste was about 30% by volume in comparison to a paste of Cu powder and a resin. This paste was coated on a glass epoxy resin substrate and was dried at 120° C. for 30 minutes. Thereafter, laser beam irradiation was performed in accordance with a desired pattern in $N_2$ gas atmosphere using a Nd:YAG laser beam (at a beam output of 6 W, a scanning speed of 20 mm/sec, and a beam spot diameter of 50 μm), and a resistance of the resultant wiring pattern was measured. The sheet resistivity was 12.7 mΩ/□. A width of the Cu film (wiring pattern) was substantially the same as the beam spot diameter of the laser beam and was about 5 μm.

EXAMPLE 6

30 parts by weight of polymethyl methacrylate were dissolved in 40 parts by weight of n-butyl acrylate and 10 parts by weight of pentaerythritol triacrylate, and 1 part by weight of benzoyl peroxide was added in addition to this. 100 parts by weight of acetylacetonic copper were added to this mixture, and the thus obtained mixture was kneaded by a roll, thereby obtaining a transparent syrup. After deaerating, this syrup was charged in a mold, and was polymerized for five hours while gradually increasing a temperature up to 60° to 80° C. Thus, a transparent thermosetting acrylic resin substrate containing copper was formed. In this substrate, a three-dimensional conductor path shown in FIG. 7 was formed using a system shown in FIG. 2.

In other words, a laser beam having a spot diameter of 50 μm, an output of 5 W, a scanning speed of 5 mm/sec (in a plane) and 1 mm/sec (along a direction of thickness) irradiated the substrate by using an Nd:YAG laser (LAY711; available from TOSHIBA). Cu was segregated from the portion irradiated with the laser beam, and therefore a Cu conductor path was formed. The substrate was moved within the plane using an X-Y table, and the focal point of the laser beam was shifted with a zoom lens. The ON/OFF operation and power of the laser beam, the X-Y table and the zoom lens were respectively controlled by a microcomputer as a CPU. In this manner, a three-dimensional conductor path shown in FIG. 7 could be formed in a substrate.

EXAMPLE 7

20 parts by weight of acetic acid copper and 60 parts by weight of polymethyl methacrylate were respectively dissolved and mixed in N,N-dimethyl formamide, thereby obtaining an organic metal-containing resin composition (insulating composition). As shown in FIG. 1A, square resistor chips (electrical parts) 12a and 12b of a size of 3.6 mm×2.6 mm×0.6 mm were mounted on an alumina substrate 11 so as to be spaced apart by 5 mm. Then, the above composition was coated to cover the chips 12a and 12b, thereby forming an insulation film 13. Thereafter, the resultant structure was dried at 80° C. for 30 minutes. A thickness of the insulation film 13 was about 25 μm above electrodes of the chips 12a and 12b and was about 50 μm between the chips 12a and 12b despite large variations. A laser beam having a spot diameter of 50 μm, an output of 6 W, and a scanning speed of 5 μm/sec (on the chips 12a and 12b) and 20 mm/sec (between the chips 12a and 12b) irradiated the resultant structure in $N_2$ atmosphere by using an Nd:YAG laser (LAY711; available from TOSHIBA). Continuity of the conductor pattern was confirmed by a tester at an electrode portion of the other end of the chip on which the conductor path was not formed. A resistance between the electrodes before irradiation with the laser beam was $10^8 \Omega$ or more.

In this example, the same connection described above between the chips could be formed by using bis(7-dichloloctadiene) nickel instead of acetic acid copper. Furthermore, when tri(2-ethylhexyl) aluminum was used instead of acetic acid copper, the same continuity of the conductor path as in this Example could be maintained by laser beam irradiation in $N_2$ gas.

As described above, according to the present invention, the same conductor path formed of a metal film as that formed by deposition can be formed using heat-decomposition of an organic polymeric material in an insulating composition and welding of a metal component. Since this conductor path is formed by welding the metal component, it has a satisfactory stabilization property and has a good conductivity (a resistivity of $10^{-3}$ $\Omega$.cm or less). Electrical parts can be connected by a single conductor path without using solder, wire and the like, thereby improving reliability of a connection. Since a laser beam can be used as a heating source, micropatterning can be easily performed by significantly focusing the laser beam. In addition, a connection distance between the parts can be minimized, thus performing higly integraged wiring of electronic devices. Furthermore, since scanning of the laser beam can be controlled by the movement of a mirror or stage, or a computer, a pattern can be easily formed without using a screen mask as in a conventional method. If a program is modified, a wiring pattern can be easily changed.

After fixing the electrical parts, a conductor path can be added thereon as needed, resulting in easy circuit design.

What is claimed is:

1. A method of forming a conductor circuit, comprising the steps of:
   providing an insulating substrate having a surface region which is formed of an electrically insulating composition comprising an organic polymeric material and at least one metal source selected from the group consisting of elemental metallic powder and an organic compound containing chemically combined metal or metals, said insulating substrate having first and second electrical parts thereon which are spaced from each other; and
   selectively heating said surface region between said first and second electrical parts along a predetermined pattern, thereby decomposing and evaporating said organic polymeric material in the heated area and welding said metal of said metal source in the heated portion such that the metal forms a continuous conductive path which connects said first and second electrical parts.

2. The method according to claim 1, wherein said metal source is the metallic powder.

3. The method according to claim 2, wherein said metallic powder is contained in an amount within a range between 5 and 35% by volume of a total volume of said organic polymeric material and said metallic powder.

4. The method according to claim 2, wherein said metallic powder is contained in an amount within a range between 10 and 20% by volume of a total volume of said organic polymeric material and said metallic powder.

5. The method according to claim 3, wherein said metallic powder has a particle diameter of not more than 0.2 $\mu$m.

6. The method according to claim 5, wherein said metallic powder is selected from the group consisting of copper, nickel, aluminum and silver powders.

7. The method according to claim 1, wherein said metal source is the organic compound chemically combining metal.

8. The method according to claim 7, wherein said organic compound is contained in an amount such that the total number of the metal atoms amounts to 0.1 to 20% of the sum of the number of the atoms constituting the organic polymeric material plus the number of the atoms constituting the organic compound chemically combining metal.

9. The method according to claim 8, wherein said total number of the metal atoms amounts to 1 to 10%.

10. The method according to claim 8, wherein said organic compound is selected from the group consisting of an alkyl metal compound, an alkoxy metal compound, metal acetylacetonate and a metal carboxylate.

11. The method according to claim 1, wherein said selective heating step is performed by irradiation with a laser beam.

12. The method according to claim 1, wherein said organic polymeric material is selected from the group consisting of a thermoplastic acrylic resin, a thermosetting acrylic resin and a polyvinyl butyral resin.

13. The method according to claim 1, wherein said insulating substrate is entirely formed of said insulating composition.

* * * * *